United States Patent
Zheng et al.

(10) Patent No.: US 12,276,020 B2
(45) Date of Patent: Apr. 15, 2025

(54) SEMICONDUCTOR CLEANING STEP

(71) Applicant: United Semiconductor (Xiamen) Co., Ltd., Fujian (CN)

(72) Inventors: William Zheng, Fujian (CN); Shih-Feng Su, Kaohsiung (TW); Chih-Chien Huang, Tainan (TW); Wen Yi Tan, Fujian (CN); Ji He Huang, Suzhou (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 48 days.

(21) Appl. No.: 18/219,716

(22) Filed: Jul. 10, 2023

(65) Prior Publication Data
US 2024/0401191 A1 Dec. 5, 2024

(30) Foreign Application Priority Data
Jun. 1, 2023 (CN) .......................... 202310642023.1

(51) Int. Cl.
*C23C 16/44* (2006.01)
*C23C 14/56* (2006.01)

(52) U.S. Cl.
CPC ........ *C23C 16/4405* (2013.01); *C23C 14/564* (2013.01)

(58) Field of Classification Search
None
See application file for complete search history.

(56) References Cited

U.S. PATENT DOCUMENTS

| | | | |
|---|---|---|---|
| 8,486,587 B2 | 7/2013 | Tsai | |
| 9,275,933 B2 | 3/2016 | Kuo | |
| 9,748,139 B1 | 8/2017 | Liou | |
| 9,761,791 B2 | 9/2017 | Shiu | |
| 10,090,465 B2 | 10/2018 | Hsu | |
| 2006/0014397 A1* | 1/2006 | Seamons | C23C 16/4401 257/E21.27 |

* cited by examiner

*Primary Examiner* — Eric W Golightly
(74) *Attorney, Agent, or Firm* — Winston Hsu

(57) ABSTRACT

The invention provides a semiconductor cleaning step, which comprises the following steps: providing a chamber with a bottom surface and a sidewall, the chamber contains a heater on the bottom surface, performing a first deposition step to leave a residual layer on the sidewall of the chamber, performing a carbon deposition step to form a carbon layer on at least the surface of the heater, and performing a plasma cleaning step to simultaneously remove the residual layer on the sidewall of the chamber and the carbon layer on the bottom surface.

12 Claims, 4 Drawing Sheets

SEMICONDUCTOR CLEANING STEP

BACKGROUND OF THE INVENTION

1. Field of the Invention

The invention relates to the field of semiconductors, in particular to a method for cleaning the chamber of a semiconductor machine, which is helpful to reduce the damage to a heater in the cleaning process.

2. Description of the Prior Art

Deposition step is one of the common steps in semiconductor manufacturing, including physical vapor deposition (PVD), chemical vapor deposition (CVD) and other processes. A target (such as a substrate) is placed in a chamber, and then various materials are deposited on the target to form a material layer. Deposition step can form various stacked material layers on the substrate, which is one of the main methods to form stacked structures in semiconductor manufacturing.

At present, during the deposition step in the semiconductor manufacturing process, it is necessary to place the target in the chamber. After the deposition step is completed, because there may be residual layers in the chamber, in order to prevent these residual layers from affecting the next deposition step, it is usually necessary to clean the chamber to ensure the good quality of the subsequent process.

However, the step of cleaning the chamber is also one of the necessary processes of semiconductor. Excessive cleaning step may lengthen the whole process time or easily cause the loss of components inside the chamber, so improving the efficiency of semiconductor process is also one of the research directions in this field.

SUMMARY OF THE INVENTION

The invention provides a semiconductor cleaning step, which comprises providing a chamber with a bottom surface and a sidewall, performing a first deposition step to leave a residual layer on the sidewall of the chamber, performing a carbon deposition step to at least form a carbon layer on the surface of the heater, and performing a plasma cleaning step to simultaneously remove the residual layer on the sidewall of the chamber and the carbon layer on the bottom surface.

In the conventional step, after the deposition step of the chamber is completed, gas plasma cleaning is performed for cleaning the interior of the chamber to remove the residual material layer remaining on the sidewall of the chamber. However, this cleaning step will also partially damage the heater at the bottom of the chamber, thus affecting the uniformity of the heater surface. The invention is characterized in that before the gas plasma cleaning step, a carbon layer is additionally deposited to cover the heater at the bottom of the chamber and the sidewall of the chamber, and then the interior of the chamber is cleaned by gas plasma, so that the heater in the chamber can be prevented from being damaged by gas plasma. In addition, the carbon layer deposition and cleaning steps are carried out in the same chamber, so that the time of vacuumizing and vacuum breaking is omitted, which is helpful to improve the overall process efficiency and automation.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
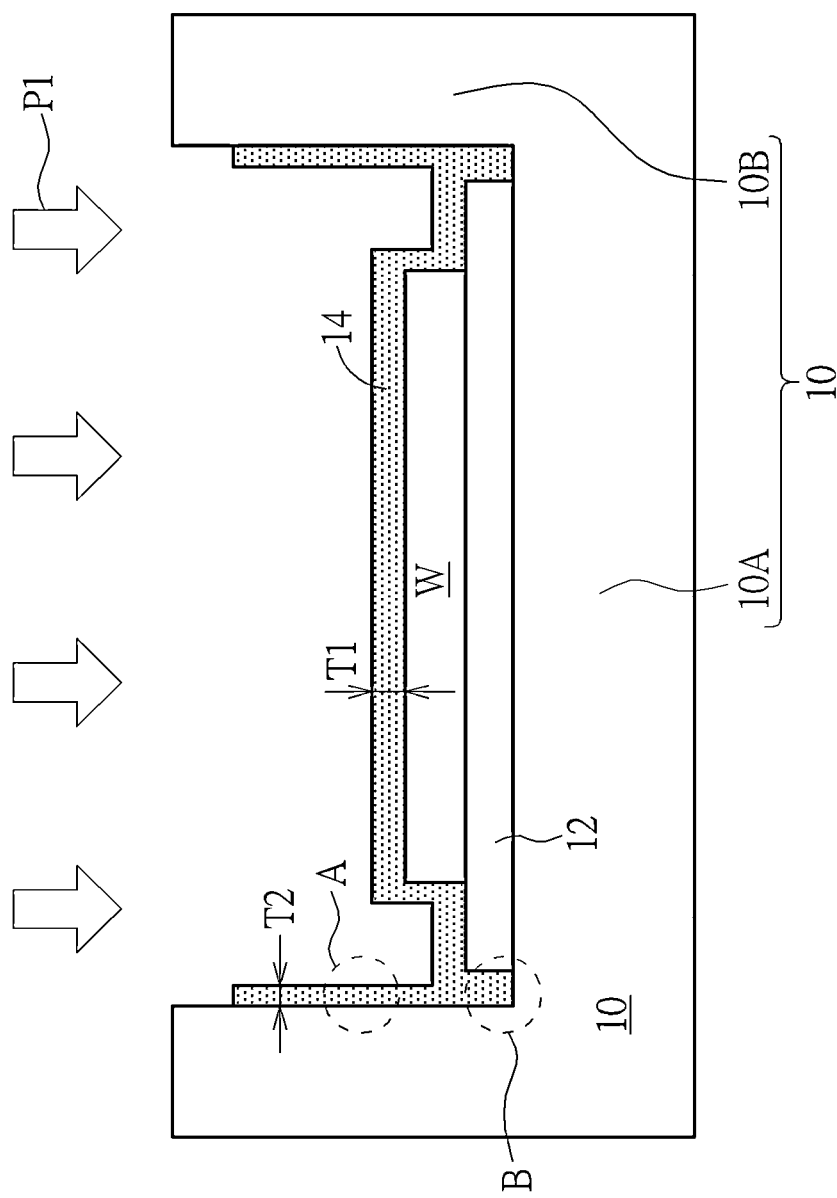
FIGS. 1 to 4 are schematic cross-sectional views of the semiconductor cleaning step of the present invention.

Please refer to FIG. 1 to FIG. 4, which show the schematic cross-sectional structure of the semiconductor cleaning step of the present invention. First, as shown in FIG. 1, a chamber 10 is provided, such as a chamber in a semiconductor machine used for a deposition step in a semiconductor manufacturing process. The chamber 10 includes a bottom surface 10A and a sidewall 10B, and a heater 12 is located on the bottom surface 10A of the chamber 10. The function of the heater 12 is to heat the target placed on the heater 12 during the deposition step. For example, when a wafer W is placed on the heater 12, the heater 12 may be used to heat the target while the deposition step is being performed or after the deposition step is completed.

Generally speaking, the heater 12 presents a flat plate shape with a flat surface. After the wafer W is placed above the heater 12, a first deposition step P1 is performed to deposit a material layer 14 on the wafer W in the chamber 10, where the material layer 14 may be a material layer of a specific material, such as one of the materials formed on the wafer W in the semiconductor manufacturing process, such as a metal material or an insulating layer, etc., and the present invention is not limited to this. It is worth noting that, because the particles of the material layer will fill the whole space in the chamber 10 during the deposition step, the material layer 14 may be formed at other places in the chamber 10, such as the heater 12, the bottom surface 10A and the sidewall 10B not covered by the wafer W, except the top of the wafer W. Here, the other material layer 14 formed outside the surface of the wafer W is defined as the residual layer 14, wherein the material layer 14 and the residual layer 14 are made of the same material. In addition, since the deposition step is mainly aimed at the bottom surface 10A of the chamber 10, and the sidewall 10B is not the main deposition target, the thickness T1 of the material layer 14 (or the residual layer 14) at the bottom surface 10A will be greater than the thickness T2 at the sidewall 10B. Besides, part of the material layer 14 near the bottom of the chamber 10 will be deposited thicker, that is to say, the thickness of the material layer 14 in the region A will be thinner than that in the region B.

Figure 2:
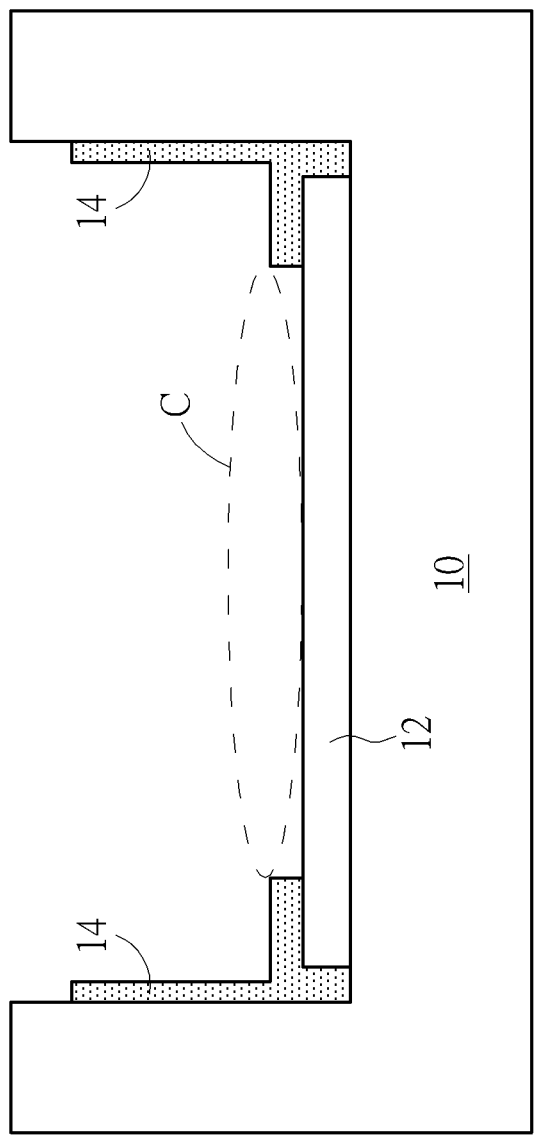

As shown in FIG. 2, after the wafer W is moved out of the chamber 10, the residual layer 14 will be disposed on the heater 12, the bottom surface 10A and the sidewall 10B not covered by the wafer W, and this part of the residual layer 14 will be removed in the subsequent cleaning step to prevent the residual layer 14 from polluting the chamber 10 and affecting other subsequent deposition processes.

In the conventional technologies, gas plasma is usually used to bombard the inside of the chamber 10 (hereinafter referred to as plasma cleaning step) to remove the residual layer 14 in the chamber 10. However, in the previous step, a part of the region C of the heater 12 was covered by the wafer W, so no residual layer 14 was formed on the surface of the region C. Therefore, during the plasma cleaning step, the plasma gas will not only remove the residual layer 14 remaining on the bottom surface 10A and sidewall 10B of the chamber 10 or the surface of the heater 12, but also bombard the surface of the region C, and may cause partial damage to the surface of the region C. If it accumulates for a long time, the surface of the heater 12 will be uneven, and the heating effect may be uneven. And if the user wants to replace the heater, because the heater is expensive and the replacement time needs to be stopped, it will also cause money and time loss.

Figure 3:
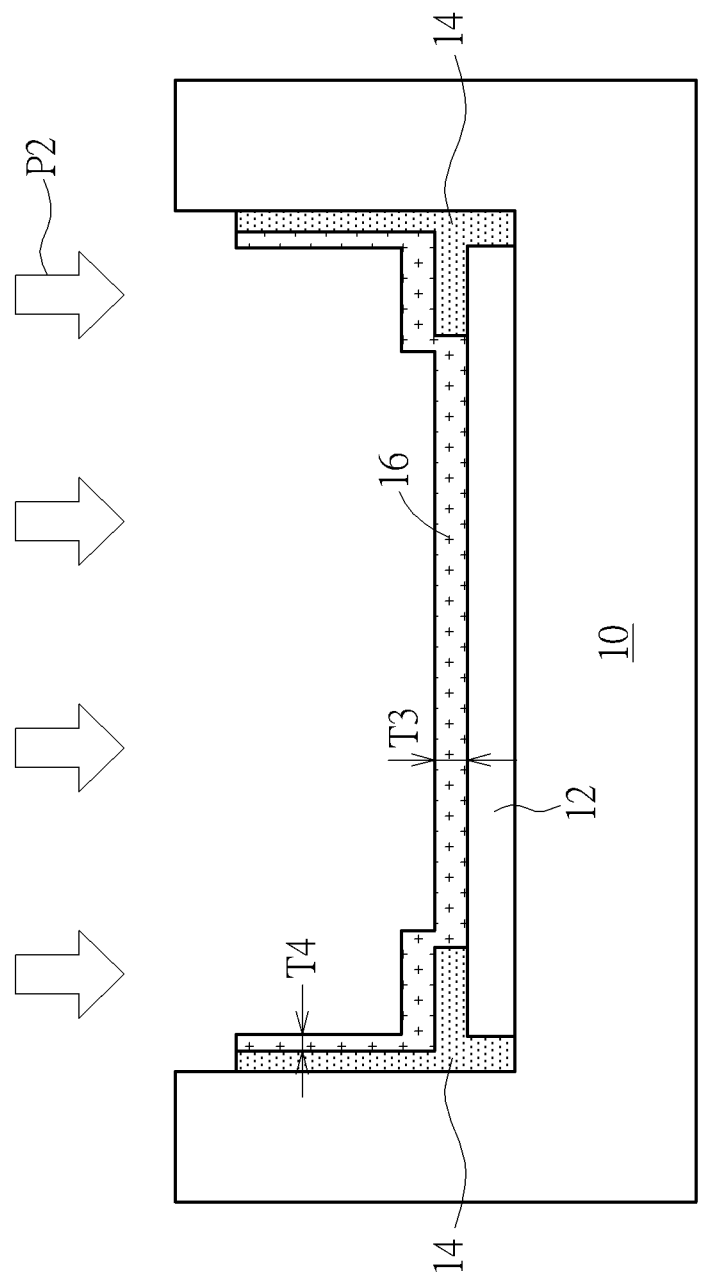
Figure 4:
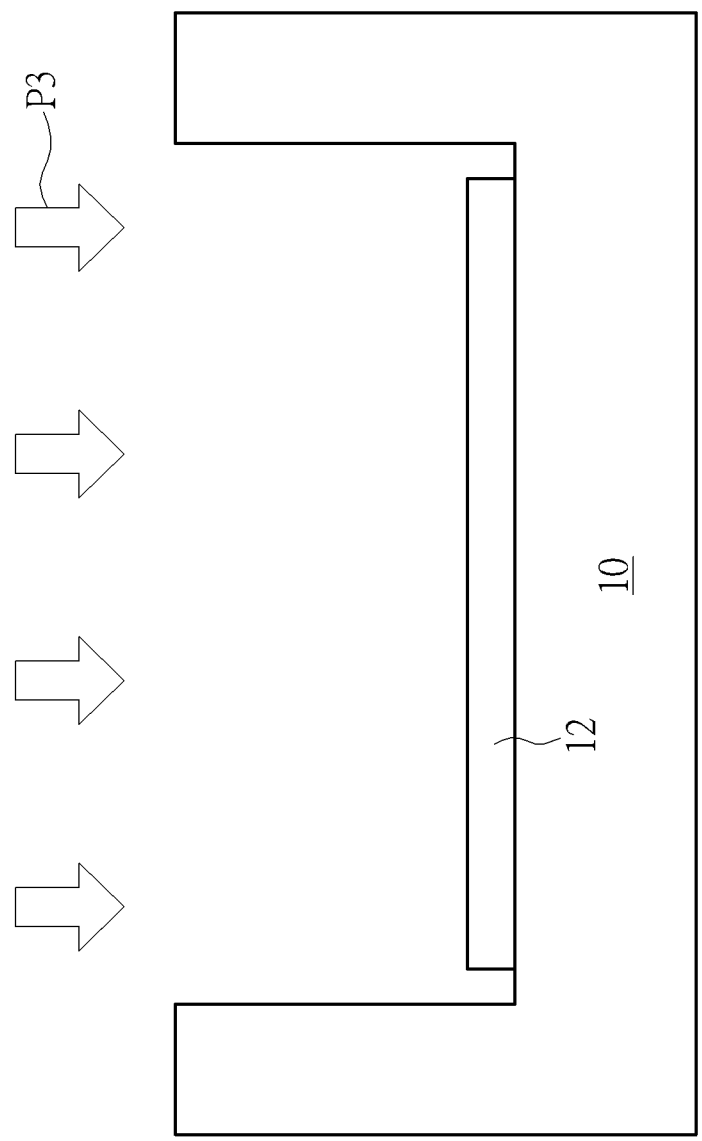

Therefore, in order to solve the above problems, the present invention provides an improved chamber cleaning method. As shown in FIG. 3, before the plasma cleaning step, a carbon deposition step P2 is performed, and an additional carbon layer 16 is deposited to cover the bottom surface 10A, the sidewall 10B of the chamber 10 and the surface of the heater 12. Because the residual layer 14 has been formed first, the carbon layer 16 will cover the residual layer 14. Similarly, since the deposition step is mainly aimed at the bottom surface 10A of the chamber 10, and the sidewall 10B is not the main deposition target, the thickness T3 of the carbon layer 16 on the bottom surface 10A will be greater than the thickness T4 on the sidewall 10B. Then, as shown in FIG. 4, a plasma cleaning step P3 is performed to remove the carbon layer 16 and the residual layer 14 remaining in the chamber 10. The plasma cleaning step P3 is, for example, nitrogen plasma and oxygen plasma, but the present invention is not limited to this. It is worth noting that since the region C is covered by the carbon layer 16, it is not easy for the gas plasma to directly bombard the surface of the heater 12 during the plasma cleaning step P3, thus achieving the effects of protecting the surface of the heater 12 and prolonging the life of the heater 12.

In the present invention, the carbon layer 16 is used to cover the residual layer 14, and other material layers (such as silicon nitride, silicon oxide, etc.) are not used to cover the residual layer 14, because the carbon material has high stability, so it is not easy to react with other material layers, and undesirable compounds will not be formed. In addition, the carbon material is relatively easy to be removed by gas plasma, so the applicant found that when the carbon layer 16 covers the residual layer 14, the removal rate of the residual layer 14 by gas plasma will be further improved, that is to say, the chamber cleaning effect can be improved.

In addition, in some other embodiments, after the wafer W is removed from the chamber 10, a blank plate (not shown) may be reloaded into the chamber 10 to cover the region C, and then the plasma cleaning step P3 is performed to remove the residual layer 14 in the chamber 10. At this time, the region C can also be protected by the blank plate without being etched by the gas plasma. However, in the first embodiment of the present invention, the method of forming the carbon layer 16 instead of covering the region C with a blank plate has several advantages. Firstly, the blank plate is usually a silicon wafer, and when the silicon wafer is bombarded by gas plasma, some particles will be scattered into the chamber, which may cause partial pollution in the chamber, while the carbon layer of the present invention is less likely to pollute the chamber 10. The second advantage is that the method of the invention does not need to load or remove the blank plate, that is, the plasma cleaning step P3 of the invention is carried out in the same chamber, which can reduce the time for vacuumizing and vacuum breaking the chamber, facilitate the automation of the process, and reduce the possibility of pollution caused by contact with the outside air. The third advantage is the formation of the carbon layer 16, which helps to improve the removal rate of the residual layer 14.

Based on the above description and drawings, the present invention provides a semiconductor cleaning step, which includes providing a chamber 10 with a bottom surface 10A and a sidewall 10B, performing a first deposition step P1 to leave a residual layer 14 on the sidewall 10B of the chamber 10, performing a carbon deposition step P2 to form a carbon layer 16 on at least the surface of the heater 12, and performing a plasma cleaning step P3 to simultaneously remove the residual layer 14 on the sidewall 10B and the carbon layer 16 on the bottom surface 10A of the chamber 10.

In some embodiments of the present invention, when the carbon layer 16 is formed, the carbon layer 16 further covers the residual layer 14 on the sidewall 10B of the chamber 10.

In some embodiments of the present invention, the residual layer 14 and the carbon layer 16 on the sidewall 10B of the chamber 10 and the carbon layer 16 on the bottom surface 10A are simultaneously removed when the plasma cleaning step P3 is performed.

In some embodiments of the present invention, performing the first deposition step P1 further includes placing a wafer W on the surface of the heater, performing the first deposition step P1, and moving the wafer W out of the chamber 10.

In some embodiments of the present invention, after the first deposition step P1, the residual layer 14 is formed on the sidewall 10B of the chamber 10, and the residual layer 14 is not formed on a part of the surface (region C) of the heater 12.

In some embodiments of the present invention, the plasma cleaning step P3 includes bombarding the carbon layer 16 and the residual layer 14 with nitrogen ions in an oxygen environment to remove the carbon layer 16 and the residual layer 14.

In some embodiments of the present invention, the carbon layer 16 does not contain silicon nitride or silicon oxide.

In some embodiments of the present invention, after the plasma cleaning step P3, a second deposition step (that is, other deposition steps in subsequent steps) is further included.

In some embodiments of the present invention, the second deposition step includes placing another wafer on the surface of the heater and depositing another material layer on the other wafer.

In some embodiments of the present invention, after the plasma cleaning step P3, the residual layer 14 on the sidewall 10B of the chamber 10 has been completely removed.

In some embodiments of the present invention, the first deposition step P1, the carbon deposition step P2 and the plasma cleaning step P3 are all performed in the chamber 10.

In some embodiments of the present invention, during the process from the carbon deposition step P2 to the completion of the plasma cleaning step P3, a vacuum state is maintained in the chamber 10, and a vacuum breaking step is not performed.

In some embodiments of the present invention, a thickness of the carbon layer 16 on the surface of the heater 12 is equal to twice a thickness of the residual layer 14 on the sidewall 10B of the chamber 10. That is, as shown in FIG. 3, the thickness T3 of the carbon layer 16 on the bottom surface 10A is approximately equal to twice the thickness T4 of the residual layer 14 on the sidewall 10B, so that the residual layer 14 can be removed at the same time when the carbon layer 16 on the bottom surface 10A is removed completely.

In the conventional step, after the deposition step of the chamber is completed, gas plasma cleaning is performed for cleaning the interior of the chamber to remove the residual material layer remaining on the sidewall of the chamber. However, this cleaning step will also partially damage the heater at the bottom of the chamber, thus affecting the uniformity of the heater surface. The invention is characterized in that before the gas plasma cleaning step, a carbon layer is additionally deposited to cover the heater at the bottom of the chamber and the sidewall of the chamber, and then the interior of the chamber is cleaned by gas plasma, so that the heater in the chamber can be prevented from being damaged by gas plasma. In addition, the carbon layer deposition and cleaning steps are carried out in the same chamber, so that the time of vacuumizing and vacuum breaking is omitted, which is helpful to improve the overall process efficiency and automation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor cleaning process comprising:
   providing a chamber, wherein the chamber comprises a bottom surface and a sidewall, and the chamber comprises a heater located on the bottom surface;
   placing a wafer on a surface of the heater;
   performing a first deposition step to leave a residual layer on the sidewall of the chamber;
   performing a carbon deposition step to form a carbon layer on at least one surface of the heater, wherein the wafer is removed out of the chamber after the first deposition step is performed and before the carbon deposition step is performed; and
   performing a plasma cleaning step to simultaneously remove the residual layer on the sidewall of the chamber and the carbon layer on the surface of the heater.

2. The semiconductor cleaning process according to claim 1, wherein when the carbon layer is formed, the carbon layer further covers the residual layer on the sidewall of the chamber.

3. The semiconductor cleaning process according to claim 2, wherein the residual layer and the carbon layer on the sidewall of the chamber and the carbon layer on the bottom surface are simultaneously removed during the plasma cleaning step.

4. The semiconductor cleaning process according to claim 1, wherein after the first deposition step, the residual layer is formed on the sidewall of the chamber, and the residual layer is not formed on a part of the surface of the heater.

5. The semiconductor cleaning process according to claim 1, wherein the plasma cleaning step comprises bombarding the carbon layer and the residual layer with nitrogen ions in an oxygen environment to remove the carbon layer and the residual layer.

6. The semiconductor cleaning process according to claim 1, wherein the carbon layer does not contain silicon nitride or silicon oxide.

7. The semiconductor cleaning process according to claim 1, further comprising performing a second deposition step after the plasma cleaning step.

8. The semiconductor cleaning process according to claim 7, wherein the second deposition step comprises:
   placing another wafer on the surface of the heater; and
   depositing a material layer on the other wafer.

9. The semiconductor cleaning process according to claim 7, wherein after the plasma cleaning step, the residual layer on the sidewall of the chamber has been completely removed.

10. The semiconductor cleaning process according to claim 1, wherein the first deposition step, the carbon deposition step and the plasma cleaning step are all performed in the chamber.

11. The semiconductor cleaning process according to claim 10, wherein from completion of the carbon deposition step through completion of the plasma cleaning step, a vacuum state is maintained in the chamber, and a vacuum breaking step is not performed.

12. The semiconductor cleaning process according to claim 1, wherein a thickness of the carbon layer on a top surface of the heater is equal to twice a thickness of the residual layer on the sidewall of the chamber.

* * * * *